United States Patent
Bolscher et al.

(10) Patent No.: US 6,468,903 B2
(45) Date of Patent: Oct. 22, 2002

(54) PRE-TREATMENT OF REACTOR PARTS FOR CHEMICAL VAPOR DEPOSITION REACTORS

(75) Inventors: Gerrit ten Bolscher, Rijssen (NL); Frank Huussen, Bilthoven (NL)

(73) Assignee: ASM International N.V. (NL)

( * ) Notice: Subject to any disclaimer, the term of this patent is extended or adjusted under 35 U.S.C. 154(b) by 0 days.

(21) Appl. No.: 10/010,450

(22) Filed: Nov. 7, 2001

(65) Prior Publication Data

US 2002/0058108 A1 May 16, 2002

Related U.S. Application Data

(60) Provisional application No. 60/249,109, filed on Nov. 15, 2000.

(51) Int. Cl.[7] .......................... H01L 21/44; H01L 21/00
(52) U.S. Cl. ..................... 438/680; 438/681; 438/800; 438/905; 427/585
(58) Field of Search ................... 438/680, 681, 438/758, 762, 800, 905; 427/585, 255.394

(56) References Cited

U.S. PATENT DOCUMENTS

| | | | |
|---|---|---|---|
| 4,389,967 A | | 6/1983 | Shimoda et al. |
| 4,428,975 A | | 1/1984 | Dahm et al. |
| 4,522,849 A | * | 6/1985 | Lewandowski ............. 427/237 |
| 5,129,958 A | * | 7/1992 | Nagashima et al. ....... 134/22.1 |
| 5,728,629 A | * | 3/1998 | Mizuno et al. ............. 438/680 |
| 6,071,573 A | * | 6/2000 | Koemtzopoulos et al. .. 427/578 |

OTHER PUBLICATIONS

Moslehi et al., "Compositional Studies of Thermally Nitrided Silicon Dioxide (Nitroxide)," J. Electrochem. Soc., vol. 132, No. 9, pp. 2189–2197 (1985) No Month.

Murarka et al., "Thermal Nitridation of Silicon in Ammonia Gas: Composition and Oxidation Resistance of the Resulting Films," J. Electrochem. Soc., vol. 126, No. 6, pp. 996–1003 (1979) No Month.

* cited by examiner

*Primary Examiner*—Alexander Ghyka
(74) *Attorney, Agent, or Firm*—Knobbe, Martens, Olson & Bear, LLP

(57) ABSTRACT

A method is provided for pre-treating reactor parts, comprising quartz or silicon, in use in chemical vapor deposition reactors. Applying the pre-treatment prior to deposition increases the cumulative deposited film thickness that can be received by the reactor parts before contamination of wafers processed in said reactors exceeds acceptable limits. The pre-treatment comprises nitridation of the surface of the reactor part, such as by heating the reactor part to a temperature of at least 800° C. and exposing the reactor part to a nitrogen-containing gas.

12 Claims, 1 Drawing Sheet

PRE-TREATMENT OF REACTOR PARTS FOR CHEMICAL VAPOR DEPOSITION REACTORS

REFERENCE TO RELATED APPLICATION

This application claims a priority benefit under 35 U.S.C. Section 119(e) to provisional application No. 60/249,109, filed Nov. 15, 2000.

FIELD OF THE INVENTION

This invention relates generally to quartz parts used in thermal reactors as used in the semiconductor industry and, in particular, to chemical vapor deposition (CVD) reactors.

BACKGROUND AND SUMMARY OF THE INVENTION

In chemical vapor deposition (CVD) reactors a film is deposited on semiconductor substrates through a chemical reaction of one or more reactants supplied in the gas phase and brought into contact with the substrates. However, a film is not only deposited on the substrates but also on reactor parts that are at high temperature. Whereas new wafers are processed in each subsequent run, such that each wafer receives the deposited film only once, the reactor parts stay continuously in place and they receive multiple depositions. After a number of accumulated depositions, the films on these reactor parts start to crack and to flake; as a consequence the wafers will be contaminated, which is undesirable.

Therefore these parts need to be cleaned before the flaking results in unacceptable particle formation. In particular, the susceptor in case of a single wafer reactor, or the wafer boat in case of a batch furnace, are critical because they are in close proximity of the wafers. When the reactor parts cycle in temperature, there is an extra risk because differences in thermal expansion coefficient between the reactor part and the deposited film result in thermal stresses. It will be clear that removing the cumulative deposited film from the reactor parts is a cumbersome job and results in down time of the reactor during which it cannot be used for production. Typically, these reactor parts are made of quartz but also silicon carbide is regularly used. The silicon carbide is often impregnated with free silicon.

Providing a coating on the reactor part prior to exposing the reactor part to the chemical vapor deposition process in the reactor to which it belongs could help to solve these problems. In particular, improving the adherence between the reactor part and the CVD coating produced in the reactor by an intermediate coating would be beneficial.

In the prior art it has been proposed to coat quartz reactor parts by chemical vapor deposition for different purposes. U.S. Pat. No. 4,389,967 suggests coating the friction-prone surfaces of a wheeled quartz boat with a CVD nitride film to prevent seizure from occurring during diffusion processes. U.S. Pat. No. 4,428,975 suggests providing the quartz tube with a CVD polysilicon coating to prevent streaks from developing on the wafers in a CVD nitride process. U.S. Pat. No. 4,522,849, suggests coating a quartz tube with CVD boron nitride to prevent contaminants from diffusion through the quartz. However, the problems solved in these prior art documents are different from the problem described here. Furthermore, it can be expected that in all cases where a film is deposited on a reactor part of completely different properties, the adherence between the film and the reactor part will not be optimal. Because quartz is a relatively soft material, particularly at the high temperatures used in the reactor, the surface of the quartz can easily be damaged by a film of different properties deposited on the quartz surface and cracks in the quartz can easily propagate.

It is an object of this invention to provide a method of pre-treatment of reactor parts used in chemical vapor deposition reactors in the semiconductor industry. The treatment should increase the cumulative deposited film thickness that can be received by the reactor part before contamination of wafers processed in said reactors exceeds acceptable limits. In this way the number of process runs that can be performed between cleaning operation can be increased, resulting in a more economical operation.

It is another object of the invention to provide a method of coating a reactor part with a film that renders the surface of the reactor part less vulnerable to damage, thereby reducing damage to the reactor part during the coating process.

It is a further object of the invention to provide a method of pre-treatment of reactor parts used in Chemical Vapor Deposition reactors that can be performed in-situ, within such reactors, without the use of a separate pre-treatment facility.

In accordance with one aspect of the invention, prior to exposure of the reactor part to the chemical vapor deposition process, the reactor part is heated to a temperature of at least about 800° C. and exposed to a nitrogen-comprising gas during some time. This process results in thermal nitridation of the surface of the quartz- or silicon-comprising reactor part. According to a further aspect of the invention, this pre-treatment is performed in-situ, within the reactor.

According to a preferred embodiment, the nitrogen-comprising gas comprises $NH_3$. Because the surface material of the reactor part is converted into silicon nitride or into silicon oxynitride, the nitrogen-rich surface film is highly interwoven with the bulk material of the reactor part and a perfect adherence is obtained. Furthermore, a gradual transition occurs from the bulk composition to the surface film composition, avoiding unwanted damage to the bulk material of the reactor part.

DETAILED DESCRIPTION OF THE PREFERRED EMBODIMENT

Figure 1:
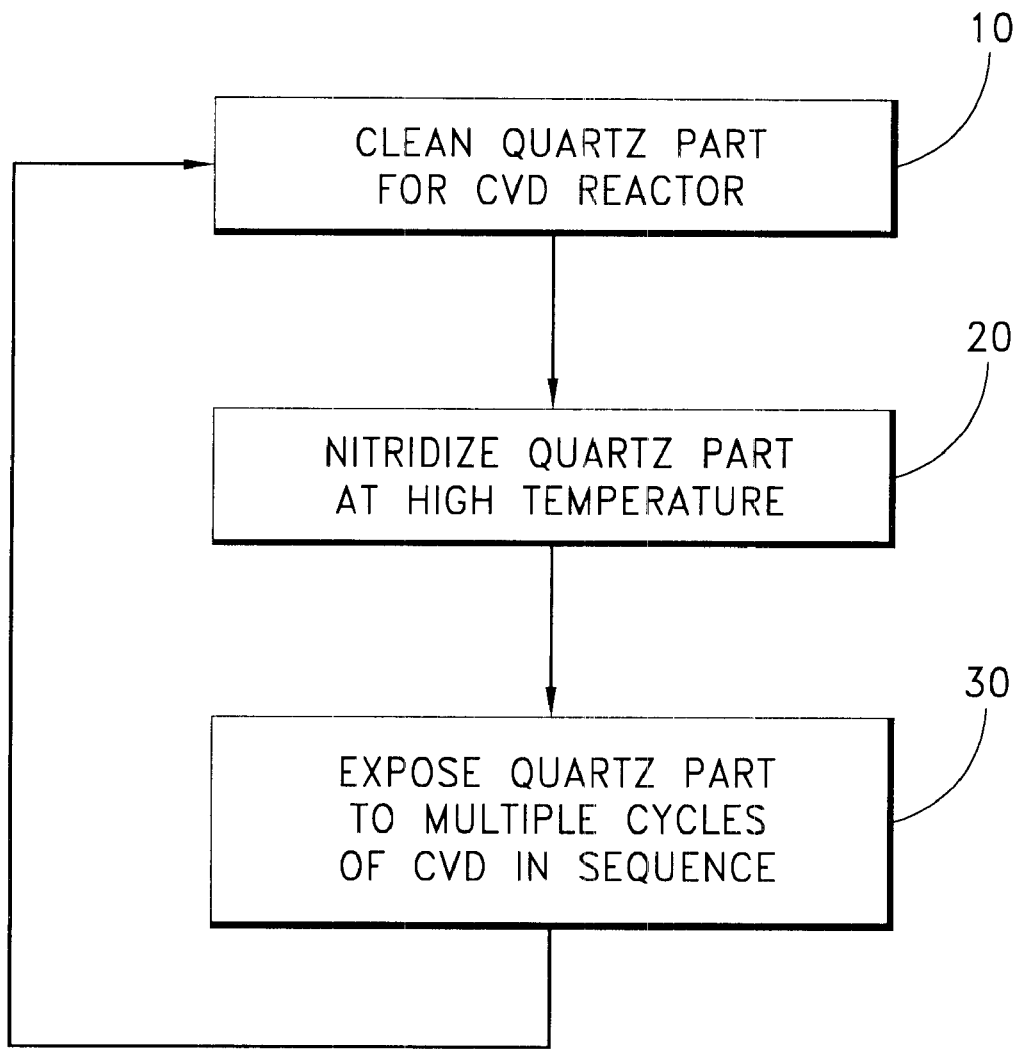
FIG. 1 is a flow chart generally illustrating a process of cleaning, treating and using parts for CVD reactors, in accordance with a preferred embodiment of the present invention.

FIG. 1 illustrates generally a process of cleaning, pretreating and using reactor parts in a chemical vapor deposition chamber. Such parts can comprise, for example, quartz racks or boats for supporting wafer(s) within the reactor. Preferably, the parts are silicon-containing, and more preferably quartz (silicon oxide).

Typically, before taking reactor parts into use, they are cleaned 10 by wet chemical procedures. Etching in aqueous solutions of HCl, $NH_3$, $H_2O_2$, HF followed by rinsing in ultra pure water or ozonated water and drying in dry nitrogen or dry air are standard procedures in the art.

After such a typical cleaning procedure 10, which is not essential for the present invention, the pre-treatment 20 according to the preferred embodiment is next performed, before the chemical vapor deposition 30 of a film onto the surface of the reactor part. Preferably, the reactor is exposed to a nitrogen source gas under conditions that lead to nitridation of the reactor part. In some embodiments, this may involve nitrogen radicals from a remote or in-situ plasma generator. Preferably, however, a nitrogen source gas is supplied at temperatures sufficient to effect thermal nitridation of the reactor part. The parts are heated, preferably to at least about 800° C. and more preferably to at least about 850° C. As an example, the following conditions could be used for the pretreatment 20: a flow of 500 sccm NH$_3$ at a pressure of 0.5 Torr (66 Pa) during 30 minutes at 850° C. However, the exact value of the process conditions do not appear to be very critical.

After applying this pre-treatment 20 according to the invention, the reactor part is taken into use in the chemical vapor deposition reactor for deposition 30 on workpieces such as silicon wafers. The reactor part can be in service in the reactor during a prolonged number of runs and receiving an increased cumulative thickness of deposition, as compared to reactor parts without such a pre-treatment.

Nevertheless, at a certain moment the particle contamination of the wafer will start to rise and the reactor part needs to be cleaned 10 again. Cleaning 10 first involves removal of the cumulative deposition and can be followed by a final cleaning process. The cleaning 10 can be performed offline, in wet chemical cleaning baths, or the cleaning 10 can be performed in-situ, by exposing the reactor parts to cleaning gas.

After cleaning 10, the pre-treatment 20 is preferably performed again prior to exposing the reactor part to the chemical vapor deposition process 30, as shown in FIG. 1. Several deposition 30 cycles can be performed before cleaning 10 is required again. Advantageously, the pre-treated parts can be used without cleaning during many more deposition cycles than untreated quartz parts can withstand before unacceptable particle generation.

It will be clear that the above-described pre-treatment 20 provides a good basis for subsequent chemical vapor deposition 30 of silicon nitride films or silicon oxynitride films. However, the above described pre-treatment 20 provides also a good basis for subsequent chemical vapor deposition 30 of polycrystalline silicon films because the nitride-rich surface film is a better match with the polycrystalline silicon, particularly as measured by coefficient of thermal expansion (CTE), than the quartz. Furthermore, the nitrided surface film is much harder and less vulnerable to cracking and damage than the relatively soft quartz material.

It will be appreciated by those skilled in the art that various modifications and changes may be made without departing from the scope of the invention. For example, the skilled artisan will readily appreciate that nitridation of quartz parts can be adapted to improve the wear of such quartz parts in a variety of other semiconductor processing equipment, in addition to the CVD reactor example set forth herein. Similar other modifications and changes are intended to fall within the scope of the invention, as defined by the appended claims.

We claim:

1. A method for pre-treatment of a quartz- or silicon-containing reactor part, used in a chemical vapor deposition reactor, which pre-treatment is performed prior to exposing the reactor part to a chemical vapor deposition process, the pre-treatment comprising:

heating the reactor part to a temperature of at least 800° C.; and nitridizing the heated reactor part by exposing the heated reactor part to a nitrogen-containing gas.

2. The method of claim 1, wherein the pre-treatment is performed within said chemical vapor deposition reactor.

3. The method of claim 1, wherein the reactor part is heated to at least 850° C.

4. The method of claim 1, wherein the nitrogen-containing gas is NH$_3$.

5. The method of claim 1, wherein the reactor part is exposed to the nitrogen containing gas for at least 30 minutes.

6. A method of semiconductor processing, comprising:

nitridizing quartz parts of a processing chamber;

loading at least one workpiece into the processing chamber;

chemical vapor depositing a layer onto the workpiece within the processing chamber; and unloading the workpiece from the processing chamber.

7. The method of claim 6, wherein nitridizing comprises heating quartz parts to at least about 800° C. and exposing the heated quartz parts to a nitrogen source gas.

8. The method of claim 7, wherein nitridizing is conducted within the processing chamber.

9. The method of claim 6, further comprising repeating loading, chemical vapor depositing and unloading workpieces in a plurality of cycles prior to cleaning accumulated deposits on the quartz parts.

10. The method of claim 9, wherein nitridizing allows repeating a greater number of the cycles before unacceptable particle generation in the process chamber, as compared to using untreated quartz parts.

11. The method of claim 9, further comprising repeating nitridizing the quartz parts after cleaning.

12. A method of treating silicon-containing parts in a high temperature semiconductor processing reactor, comprising:

heating the parts within the reactor to at least 800° C. in the absence of a semiconductor substrate; and exposing the parts within the reactor to a nitrogen-containing gas, wherein the nitrogen-containing gas does not deposit a film on the parts.

* * * * *